(12) United States Patent
Wang et al.

(10) Patent No.: US 8,828,517 B2
(45) Date of Patent: Sep. 9, 2014

(54) STRUCTURE AND METHOD FOR IMPROVING SOLAR CELL EFFICIENCY AND MECHANICAL STRENGTH

(75) Inventors: David Xuan-Qi Wang, Fremont, CA (US); Mehrdad M. Moslehi, Los Altos, CA (US); Pawan Kapur, Palo Alto, CA (US); Suketu Parikh, San Jose, CA (US)

(73) Assignee: Solexel, Inc., Milpitas, CA (US)

( * ) Notice: Subject to any disclaimer, the term of this patent is extended or adjusted under 35 U.S.C. 154(b) by 915 days.

(21) Appl. No.: 12/728,772

(22) Filed: Mar. 22, 2010

(65) Prior Publication Data
US 2010/0294333 A1 Nov. 25, 2010

Related U.S. Application Data

(60) Provisional application No. 61/162,546, filed on Mar. 23, 2009.

(51) Int. Cl.
*H01L 27/14* (2006.01)
*B32B 33/00* (2006.01)
*B32B 3/12* (2006.01)

(52) U.S. Cl.
USPC ............ 428/116; 136/244; 136/249; 136/252

(58) Field of Classification Search
CPC ............................. H01L 27/1423; Y02E 10/50
USPC ......... 428/116, 118, 66.6; 136/243–246, 249, 136/252, 256, FOR. 000; 257/E27.124–E27.126, E25.007, 257/E25.009, E31.11
See application file for complete search history.

(56) References Cited

U.S. PATENT DOCUMENTS

| | | |
|---|---|---|
| 4,043,894 A | 8/1977 | Gibbs |
| 4,070,206 A | 1/1978 | Kressel et al. |
| 4,082,570 A | 4/1978 | House et al. |
| 4,165,252 A | 8/1979 | Gibbs |
| 4,249,959 A | 2/1981 | Jebens |
| 4,251,679 A | 2/1981 | Zwan |
| 4,348,254 A | 9/1982 | Lindmayer |
| 4,361,950 A | 12/1982 | Amick |

(Continued)

FOREIGN PATENT DOCUMENTS

| | | |
|---|---|---|
| JP | 06-260670 A | 9/1994 |
| JP | 2002-2299661 A | 10/2002 |
| WO | PCT/EP1999/008573 | 5/2000 |

OTHER PUBLICATIONS

Alvin D. Compaan, Photovoltaics: Clean Power for the 21st Century, Solar Energy Materials & Solar Cells, 2006, pp. 2170-2180, vol. 90, Elsevier B.V.

(Continued)

*Primary Examiner* — David Sample
*Assistant Examiner* — Nicholas W Jordan

(57) ABSTRACT

A three-dimensional thin film solar cell (3-D TFSC) substrate having enhanced mechanical strength, light trapping, and metal modulation coverage properties. The substrate includes a plurality of unit cells, which may or may not be different. Unit cells are defined as a small self-contained geometrical pattern which may be repeated. Each unit cell structure includes a wall enclosing a trench. Further, the unit cell includes an aperture having an aperture diameter. A predetermined variation in wall thickness, wall height, and aperture diameter among unit cells across the substrate produces specific advantages.

2 Claims, 8 Drawing Sheets

(56) References Cited

U.S. PATENT DOCUMENTS

| | | | |
|---|---|---|---|
| 4,409,423 A | 10/1983 | Holt | |
| 4,427,839 A * | 1/1984 | Hall | 136/256 |
| 4,461,922 A | 7/1984 | Gay et al. | |
| 4,479,847 A | 10/1984 | McCaldin et al. | |
| 4,626,613 A | 12/1986 | Wenham et al. | |
| 4,672,023 A | 6/1987 | Leung | |
| 4,922,277 A | 5/1990 | Carlson et al. | |
| 5,024,953 A | 6/1991 | Uematsu et al. | |
| 5,073,230 A | 12/1991 | Maracas et al. | |
| 5,112,453 A | 5/1992 | Behr et al. | |
| 5,208,068 A | 5/1993 | Davis | |
| 5,248,621 A | 9/1993 | Sano | |
| 5,316,593 A | 5/1994 | Olson et al. | |
| 5,348,618 A | 9/1994 | Canham et al. | |
| 5,397,400 A | 3/1995 | Matsuno et al. | |
| 5,459,099 A | 10/1995 | Hsu | |
| 5,494,832 A | 2/1996 | Lehmann et al. | |
| 5,538,564 A | 7/1996 | Kaschmitter | |
| 5,645,684 A | 7/1997 | Keller | |
| 5,660,680 A | 8/1997 | Keller | |
| 5,681,392 A | 10/1997 | Swain | |
| 5,882,988 A | 3/1999 | Haberern et al. | |
| 5,928,438 A | 7/1999 | Salami | |
| 6,091,021 A | 7/2000 | Ruby | |
| 6,096,229 A | 8/2000 | Shahid | |
| 6,114,046 A | 9/2000 | Hanoka | |
| 6,127,623 A | 10/2000 | Nakamura et al. | |
| 6,204,443 B1 | 3/2001 | Kiso et al. | |
| 6,294,725 B1 | 9/2001 | Hirschberg et al. | |
| 6,331,208 B1 | 12/2001 | Nishida et al. | |
| 6,399,143 B1 | 6/2002 | Sun et al. | |
| 6,416,647 B1 | 7/2002 | Dordi et al. | |
| 6,429,037 B1 | 8/2002 | Wenham et al. | |
| 6,441,297 B1 | 8/2002 | Keller et al. | |
| 6,448,155 B1 | 9/2002 | Iwasaki et al. | |
| 6,461,932 B1 | 10/2002 | Wang | |
| 6,524,880 B2 | 2/2003 | Moon et al. | |
| 6,534,336 B1 | 3/2003 | Iwane | |
| 6,555,443 B1 | 4/2003 | Artmann et al. | |
| 6,566,235 B2 | 5/2003 | Nishida et al. | |
| 6,602,760 B2 | 8/2003 | Poortmans et al. | |
| 6,602,767 B2 | 8/2003 | Nishida et al. | |
| 6,613,148 B1 | 9/2003 | Rasmussen | |
| 6,624,009 B1 | 9/2003 | Green et al. | |
| 6,645,833 B2 | 11/2003 | Brendel | |
| 6,649,485 B2 | 11/2003 | Solanki et al. | |
| 6,653,722 B2 | 11/2003 | Blalock | |
| 6,664,169 B1 | 12/2003 | Iwasaki et al. | |
| 6,756,289 B1 | 6/2004 | Nakagawa et al. | |
| 6,881,644 B2 | 4/2005 | Malik et al. | |
| 6,946,052 B2 | 9/2005 | Yanagita et al. | |
| 6,964,732 B2 | 11/2005 | Solanki | |
| 7,022,585 B2 | 4/2006 | Solanki et al. | |
| 7,026,237 B2 | 4/2006 | Lamb | |
| 7,368,756 B2 | 5/2008 | Bruhns et al. | |
| 7,402,523 B2 | 7/2008 | Nishimura | |
| 8,329,046 B2 * | 12/2012 | Dove et al. | 136/256 |
| 2002/0153039 A1 | 10/2002 | Moon et al. | |
| 2002/0168592 A1 | 11/2002 | Vezenov | |
| 2002/0179140 A1 | 12/2002 | Toyomura | |
| 2003/0017712 A1 | 1/2003 | Brendel | |
| 2003/0039843 A1 | 2/2003 | Johnson | |
| 2003/0124761 A1 | 7/2003 | Baert | |
| 2004/0028875 A1 | 2/2004 | Van Rijn | |
| 2004/0173790 A1 | 9/2004 | Yeo | |
| 2004/0259335 A1 | 12/2004 | Narayanan | |
| 2004/0265587 A1 | 12/2004 | Koyanagi | |
| 2005/0160970 A1 | 7/2005 | Niira | |
| 2005/0172998 A1 | 8/2005 | Gee et al. | |
| 2005/0176164 A1 | 8/2005 | Gee et al. | |
| 2005/0177343 A1 | 8/2005 | Nagae | |
| 2005/0199279 A1 | 9/2005 | Yoshimine et al. | |
| 2005/0274410 A1 | 12/2005 | Yuuki et al. | |
| 2005/0281982 A1 | 12/2005 | Li | |
| 2006/0021565 A1 | 2/2006 | Zahler et al. | |
| 2006/0043495 A1 | 3/2006 | Uno | |
| 2006/0054212 A1 | 3/2006 | Fraas et al. | |
| 2006/0070884 A1 | 4/2006 | Momoi et al. | |
| 2006/0105492 A1 | 5/2006 | Veres et al. | |
| 2006/0196536 A1 | 9/2006 | Fujioka et al. | |
| 2006/0231031 A1 | 10/2006 | Dings et al. | |
| 2006/0266916 A1 | 11/2006 | Miller et al. | |
| 2006/0283495 A1 | 12/2006 | Gibson | |
| 2007/0077770 A1 | 4/2007 | Wang et al. | |
| 2007/0082499 A1 | 4/2007 | Jung et al. | |
| 2008/0047601 A1 | 2/2008 | Nag et al. | |
| 2008/0157283 A1 | 7/2008 | Moslehi | |
| 2008/0210294 A1 | 9/2008 | Moslehi | |
| 2008/0264477 A1 | 10/2008 | Moslehi | |
| 2008/0289684 A1 | 11/2008 | Moslehi | |
| 2008/0295887 A1 | 12/2008 | Moslehi | |
| 2009/0042320 A1 | 2/2009 | Wang et al. | |
| 2009/0107545 A1 | 4/2009 | Moslehi | |
| 2009/0301549 A1 | 12/2009 | Moslehi | |
| 2010/0022074 A1 | 1/2010 | Wang et al. | |
| 2010/0116316 A1 | 5/2010 | Moslehi et al. | |
| 2011/0108098 A1 * | 5/2011 | Kapur | 136/255 |

OTHER PUBLICATIONS

C.Berge, 150-mm Layer Transfer for Monocrystalline Silicon Solar Cells, Solar Energy Materials & Solar Cells, 2006, pp. 3102-3107, vol. 90, Elsevier B.V.

C.Oules et al, Silicon on Insulator Structures Obtained by Epitaxial Growth of Silicon over Porous Silicon, Journal of the Electrochemical Society, Inc., 1992, p. 3595, vol. 139, No. 12, Meylan Cedex, France.

C.S.Solanki, et al, Porous Silicon Layer Transfer Processes for Solar Cells, Solar Energy Materials & Solar Cells, 2004, pp. 101-113, vol. 83, Elsevier B.V., Leuven, Belgium.

C.S.Solanki, et al, Self-Standing Porous Silicon Films by One-Step Anodizing, Journal of Electrochemical Society, 2004, pp. C307-C314, vol. 151, The Electrochemical Society, Inc., Leuven, Belgium.

F.Duerinckx, et al, Reorganized Porous Silicon Bragg Reflectors for Thin-Film Silicon Solar Cells, IEEE Electron Device Letters, Oct. 2006, vol. 27, No. 10.

Francois J. Henley, Layer-Transfer Quality Cleave Principles, SiGen, Jul. 8, 2005, pp. 1-6, The Silicon Genesis Corporation, San Jose, California.

H.J.Kim, et al, Large-Area Thin-Film Free-Standing Monocrystalline Si Solar cells by Layer Transfer, Leuven, Belgium, IEEE.

J.H.Werner et al, From Polycrystalline to Single Crystalline Silicon on Glass, Thin Solid Films, 2001, pp. 95-100, vol. 383, Issue 1-2, Elsevier Science B.V., Germany.

J.J. Schermer et al., Epitaxial Lift-Off for large area thin film III/V devices, phys. Stat. sol. (a) 202, No. 4, 501-508 (2005).

Jianhua Zhao, et al, A 19.8% Efficient Honeycomb Multicrystalline Silicon Solar Cell with Improved Light Trapping, IEEE Transactions on Electron Devices, 1999, vol. 46, No. 10.

K. Van Nieuwenhuysen et al., Progress in epitaxial deposition on low-cost substrates for thin-film crystalline silicon solar cells at IMEC, Journal of Crystal Growth, 2006, pp. 438-441, vol. 287, Elsevier B.V., Leuven, Belgium.

K.L. Chopra et al., Thin-Film Solar Cells: An Overview, Progress in Photovoltaics: Research and Applications, 2004, pp. 69-92, vol. 12, John Wiley & Sons, Ltd.

Lammert et al., The Interdigitated Back Contact Solar Cell: A Silicon Solar Cell for Use in Concentrated Sunlight, IEEE Transactions on Electron Devices, pp. 337-342.

MacDonald et al., "Design and Fabrication of Highly Topographic Nano-imprint Template for Dual Damascene Full 3-D Imprinting," Dept. of Chemical Eng., University of Texas at Austin, Oct. 24, 2005.

Martin A. Green, Consolidation of Thin-Film Photovoltaic Technology: The Coming Decade of Opportunity, Progress in Photovoltaics: Research and Applications, 2006, pp. 383-392, vol. 14, John Wiley & Sons, Ltd.

Martin A. Green, Silicon Photovoltaic Modules: A Brief History of the First 50 Years, Progress in Photovoltaics: Research and Applications, 2005, pp. 447-455, vol. 13, John Wiley & Sons, Ltd.

(56) References Cited

OTHER PUBLICATIONS

Nobuhiko Sato et al, Epitaxial Growth on Porous Si for a New Bond and Etchback Silicon-on-Insulator, Journal of Electrochemical Society, Sep. 1995, vol. 142, No. 9, The Electrochemical Society, Inc., Hiratsuka, Japan.

P.J.Verlinden, et al, Sliver® Solar Cells: A New Thin-Crystalline Silicon Photovoltaic Technology, Solar Energy Materials & Solar Cells, 2006, pp. 3422-3430, vol. 90, Elsevier B.V.

P.R. Hageman et al., Large Area, Thin Film Epitaxial Lift Off III/V Solar Cells, 25th PVSC, May 13-17, 1996, Washington D.C., IEEE.

Photovoltaic Technology Research Advisory Council, A Vision for Photovoltaic Technology, 2005, pp. 1-41, European Commision Publications Office.

Prometheus Institute, U.S. Solar Industry Year in Review: U.S. Solar Energy Industry Charging Ahead, (SEIA) The Solar Energy Industry Association.

R.Brendel, et al, Sol-Gel Coatings for Light Trapping in Crystalline Thin Film Silicon Solar Cells, Journal of Non-Crystalline Solids, 1997, pp. 391-394, vol. 218, Elsevier Science B.V., Germany.

Richard Auer et al, Simplified Transfer Process for High-Current Thin-Film Crystalline Si Solar Modules, 3rd World Conference on Photovoltaic Energy Conversion, May 11-18, 2003, Osaka, Japan.

Richard M. Swanson, A Vision for Crystalline Silicon Photovoltaics, Progress in Photovoltaics: Research and Applications, 2006, pp. 443-453, vol. 14, John Wiley & Sons, Ltd.

Rolf Brendel, A Novel Process for Ultrathin Monocrystalline Silicon Solar Cells on Glass, 14th European Photovolaic Solar Energy Conference, Jun. 30-Jul. 4, 1997, Barcelona, Spain.

Rolf Brendel, Review of Layer Transfer Processes for Cystalline Thin-Film Silicon Solar Cells, The Japan Journal of Applied Physics, 2001, pp. 4431-4439, vol. 40, Part 1, No. 7, The Japan Society of Applied Physics, Japan.

Rolf Brendel, Thin-Film Crystalline Silicone Mini-Modules Using Porous Si for Layer Transfer, Solar Energy, 2004, pp. 969-982, vol. 77, Elsevier Ltd., Germany.

S. Hegedus, Thin Film Solar Modules: The Low Cost, High Throughput and Versatile Alternative to Si Wafers, Progress in Photvoltaics: Research and Applications, 2006, pp. 393-411, vol. 14, John Wiley & Sons, Ltd.

Takao Yonehara, et al, Epitaxial Layer Transfer by Bond and Etch Back of Porous Si, Applied Physics Letter 64, Apr. 18, 1994, vol. 16, American Institute of Physics.

Toshiki Yagi, et al, Ray-Trace Simulation of Light Trapping in Silicon Solar Cell with Texture Structures, Solar Energy Materials & Solar Cells, 2006, pp. 2647-2656, vol. 90, Elsevier B.V.

\* cited by examiner

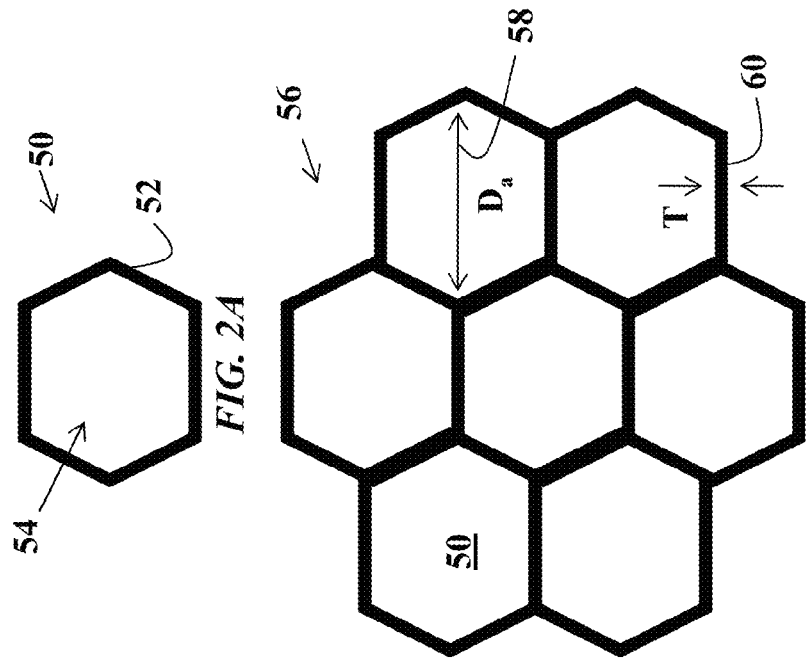
*FIG. 2A*
*FIG. 2B*
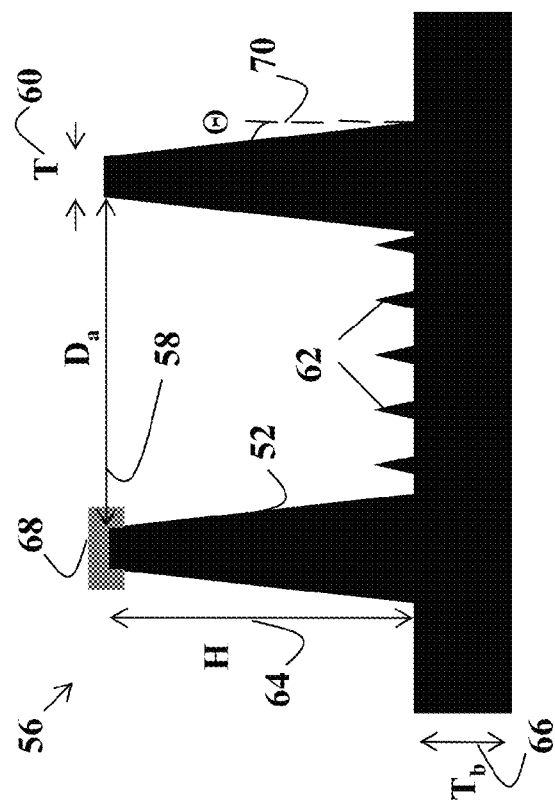
*FIG. 2C*

STRUCTURE AND METHOD FOR IMPROVING SOLAR CELL EFFICIENCY AND MECHANICAL STRENGTH

CROSS REFERENCE TO RELATED APPLICATIONS

This application claims priority to provisional application Ser. No. 61/162,546 which is hereby incorporated by reference in its entirety.

Reference is now also made to co-pending U.S. Pub. No. 2008/0295887, entitled "THREE-DIMENSIONAL THIN-FILM SOLAR CELLS," (the '887 publication) having common inventor with the present disclosure and which is hereby expressly incorporated by reference.

FIELD

This disclosure relates in general to the field of solar cells and solar cell manufacturing. Particularly, the present disclosure relates to enhanced three-dimensional thin film solar cells and methods of manufacturing the same.

BACKGROUND

Three-dimensional thin film solar cell (3-D TFSC) substrates afford cost, performance, and mechanical strength advantages. Compared to traditional flat solar cells with a similar amount of silicon, 3-D TFSCs have superior mechanical strength, better light trapping, and lower cell processing costs because of their self-aligned nature.

The '887 publication discloses, in one embodiment, a three-dimensional honeycomb structure for solar cell production. This honeycomb structure provides enhanced mechanical strength, allowing for processing of preferably free-standing thin substrates, which for the same silicon volume are otherwise mechanically not robust. Traditionally, flat solar cells need to be bonded to a host substrate (e.g., glass), putting temperature constraints on subsequent processing (thus compromising performance) and adding extra cost. In addition, there is parasitic absorption from both the glass substrate and the adhesive used to bond the silicon with the glass, causing solar cell efficiency to be compromised.

Further, 3-D TFSC substrates are inherently better at trapping light than traditional untextured planar solar cells. Ordinarily, a lot of long-wavelength light from the top surface of an equivalent-silicon-volume two-dimensional structure would escape. In a three-dimensional structure, this light will be trapped in the trenches. Finally, 3-D TFSC substrates reduce downstream process steps, further reducing cost.

Despite all the advantages of 3-D TFSC substrates, even greater mechanical strength, efficiency, and potential cost reductions may still be possible. Typically, a template, having reverse features of the resulting 3-D TFSC substrate, is re-used several times to form many 3-D TFSC substrates. Because of the epitaxial deposition process used to form the 3-D TFSC substrates, the template may in some embodiments have wide trenches. Wide trenches in the template correspond to wide silicon wall thickness in the resulting 3-D TFSC substrate. If unit cell apertures are left the same while increasing silicon wall thickness, a performance reduction results. This is due to the fact that the fractional metal coverage increases (assuming that all the ridges are metalized), since metal contacts the exposed silicon on the ridges. Presence of metal prevents sun light from being coupled to the solar cell as it reflects the light falling on it.

To increase efficiency through a reduction of optical reflection losses due to metallization, unit cell apertures may be increased, resulting in a reduction in fractional metal coverage. However, this tradeoff reduces the effective mechanical strength of the 3-D TFSC substrate.

Known methods and systems lack a powerful mechanism for achieving easily implementable tradeoffs between mechanical strength, efficiency, cost reduction, and fractional metal coverage on the solar cell.

SUMMARY

Therefore a need has arisen for a three-dimensional thin film solar cell (3-D TFSC) substrate and method of manufacture which enhances mechanical strength, while keeping the efficiency high by keeping a low metal coverage. In addition, it does not increase processing cost associated with 3-D TFSC substrate production.

Spatial variations in unit cell aperture diameters, wall thicknesses, and/or wall heights laterally across a single solar cell, enable specific gains and efficient tradeoff decisions to be made. Further, for a specific 3-D TFSC substrate design, only the mask design needs to be changed. Other processing steps may remain the same. Thus, varying unit cell dimensions adds very little overhead to the existing processes. In fact, costs may actually be reduced.

Additionally, variations in wall heights may enable targeted tradeoffs between mechanical strength, light trapping efficiencies, and metal coverage. The wall height impacts metal coverage in an indirect way, primarily through the means by which the metal is applied on silicon. Because several of the metal application techniques rely on planarity of the surface, any variation in height allows only the tallest structures to be covered, with no coverage on the shorter or recessed structures. Since several techniques used for creating the TFSC mold, naturally lend themselves to producing a correlation between wall thickness and wall height, variations in wall thickness may be used to produce variations in wall height. A specific example of this technique is using any of dry etching techniques, where the process can be tuned to give a correlation between the opening dimension and the depth of etching.

Variations in unit cell dimensions across the 3-D TFSC substrate may also produce advantages in metal coverage. For example, by interweaving large-aperture unit cells with small-aperture unit cells in a grid-like pattern, metal stringer busbars may be soldered onto the 3-D TFSC substrate in a grid-like pattern. The busbars thus achieved could, hence, be made to conform to standard patterns.

The methods of the present disclosure may increase yield and throughput by increasing the mechanical strength of 3-D TFSC substrates.

The present disclosure presents a three-dimensional thin film solar cell substrate having enhanced mechanical strength, light trapping, and metal modulation coverage properties. The substrate includes a plurality of unit cells. Each unit cell structure includes a wall enclosing a trench. Further, the unit cell includes an aperture having an aperture diameter. For the purposes of the present disclosure, the dimensions of interest include wall thickness, wall height, and aperture diameter. A pre-determined variation in these dimensions among unit cells across the substrate produces specific advantages. A variation in wall thickness enables enhanced mechanical strength by increasing silicon volume in specific areas of the substrate. A variation in wall height allows enhanced metal coverage modulation properties. In addition, it can also enable soldering to external metal in specific areas of the substrate. A variation in aperture diameter enables enhanced mechanical strength by reducing the aperture diameter in specific areas of the substrate. Each variation also enables better light trapping since a 3-D TFSC substrate inherently traps light better than a two-dimensional substrate.

These and other advantages of the disclosed subject matter, as well as additional novel features, will be apparent from the description provided herein. The intent of this summary is not to be a comprehensive description of the claimed subject matter, but rather to provide a short overview of some of the subject matter's functionality. Other systems, methods, features and advantages here provided will become apparent to one with skill in the art upon examination of the following FIGURES and detailed description. It is intended that all such additional systems, methods, features and advantages included within this description, be within the scope of the accompanying claims.

BRIEF DESCRIPTIONS OF THE DRAWINGS

The features, nature, and advantages of the disclosed subject matter may become more apparent from the detailed description set forth below when taken in conjunction with the drawings in which like reference numerals indicate like features and wherein:

FIG. 1 shows an exemplary process flow for fabricating hexagonal-prism 3-D TFSCs using single-aperture TFSC substrates including rear base layers;

FIGS. 2A through 2C provide an exemplary unit cell, honeycomb structure, and the dimensions of interest;

FIG. 3 gives an illustrative view of a three-dimensional thin film solar cell (3-D TFSC) substrate wherein the unit cell aperture changes abruptly;

FIG. 4 provides an exemplary process flow for forming metal contacts on a 3-D TFSC substrate;

Figure 7A:
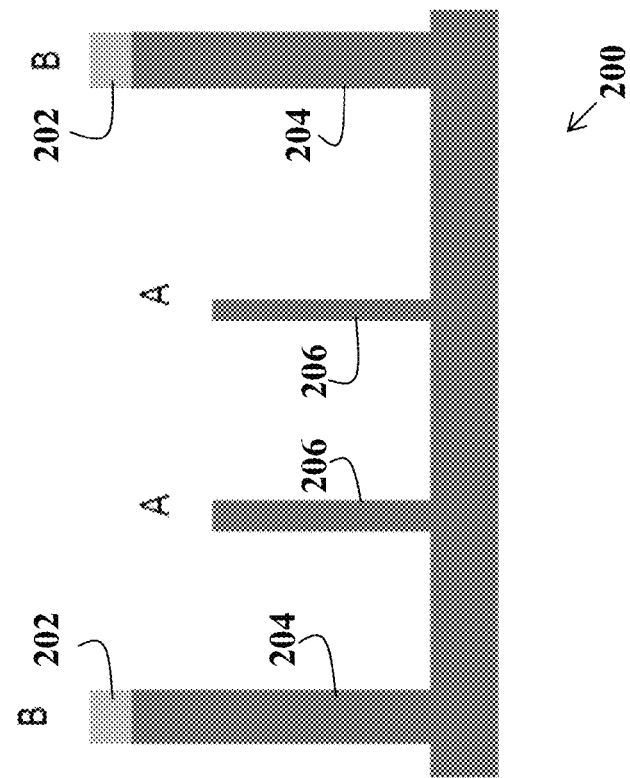
Figure 7B:
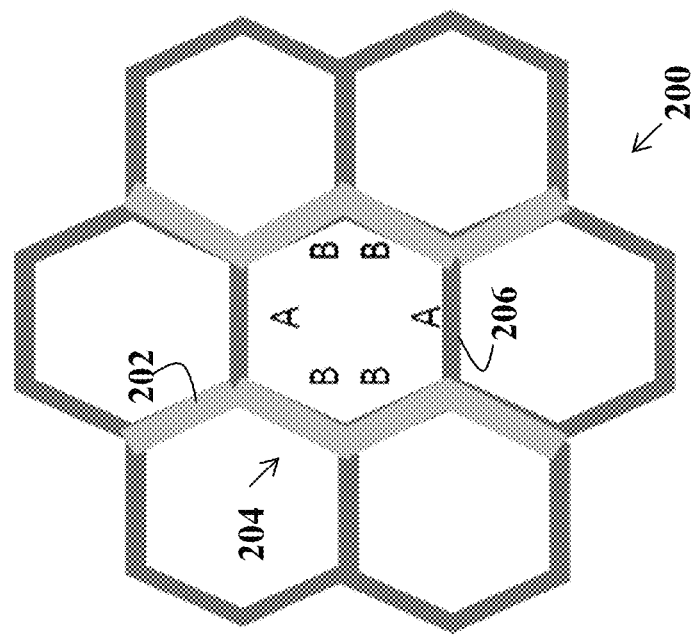

FIGS. 7A and 7B provide cross-sectional and top-views of a 3-D TFSC substrate with variable wall thickness and wall height.

Figure 8:
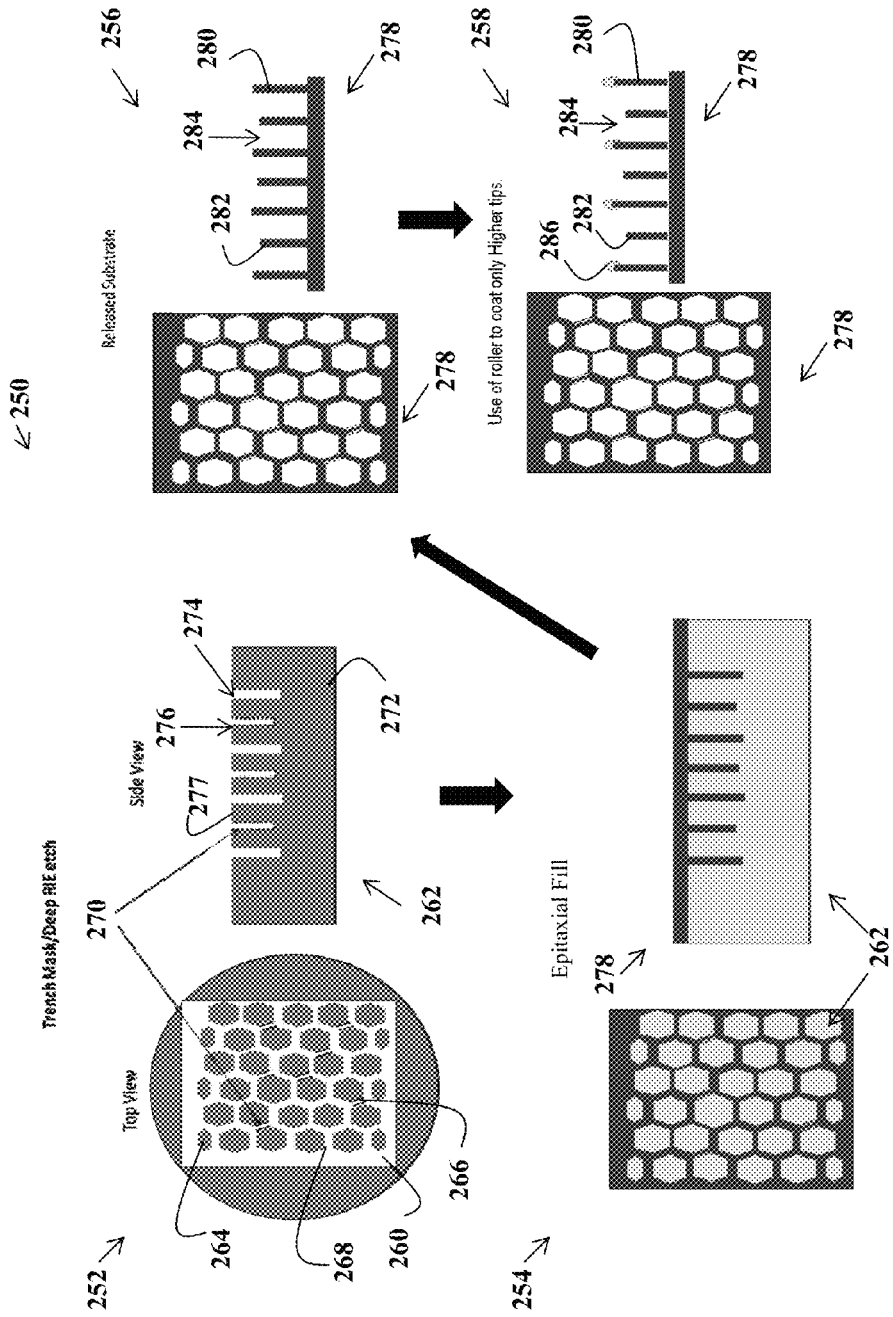
Figure 9:
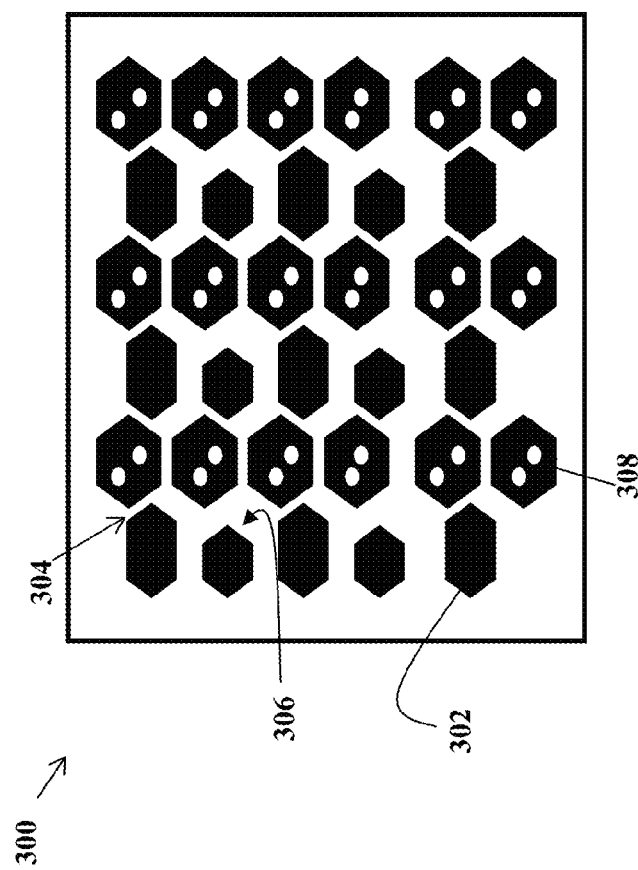

FIG. 8 provides an exemplary process flow for creating variable wall heights in a 3-D TFSC substrate;

FIG. 9 illustrates an exemplary positive-mask for forming a template and, in turn, a 3-D TFSC.

DETAILED DESCRIPTION

The following description is not to be taken in a limiting sense, but is made for the purpose of describing the general principles of the present disclosure. The scope of the present disclosure should be determined with reference to the claims. Exemplary embodiments of the present disclosure are illustrated in the drawings, like numbers being used to refer to like and corresponding parts of the various drawings.

The present disclosure presents novel structures as well as methods of manufacture which significantly improve efficiency, cost, and mechanical strength of three-dimensional thin film solar cell (3-D TFSC) substrates. In addition, its relatively simple implementation serves as a powerful way to achieve tradeoffs between the aforementioned solar cell metrics.

Although specific reference is made herein to a honeycomb structure, the implementation is generally applicable to any geometrical shape and any taper-angled trenches with arbitrary depth. The specific honeycomb implementation only serves to demonstrate the advantages and one possible implementation.

A preferred semiconductor material for the 3-D TFSC is crystalline silicon (c-Si), although other semiconductor materials may also be used. One embodiment uses monocrystalline silicon as the thin film semiconductor material. Other embodiments use multicrystalline silicon, polycrystalline silicon, microcrystalline silicon, amorphous silicon, porous silicon, and/or a combination thereof. The designs here are also applicable to other semiconductor materials such as germanium, silicon germanium, silicon carbide, a crystalline compound semiconductor, or a combination thereof. Additional applications include copper indium gallium selenide (CIGS) and cadmium telluride semiconductor thin films.

Figure 1:
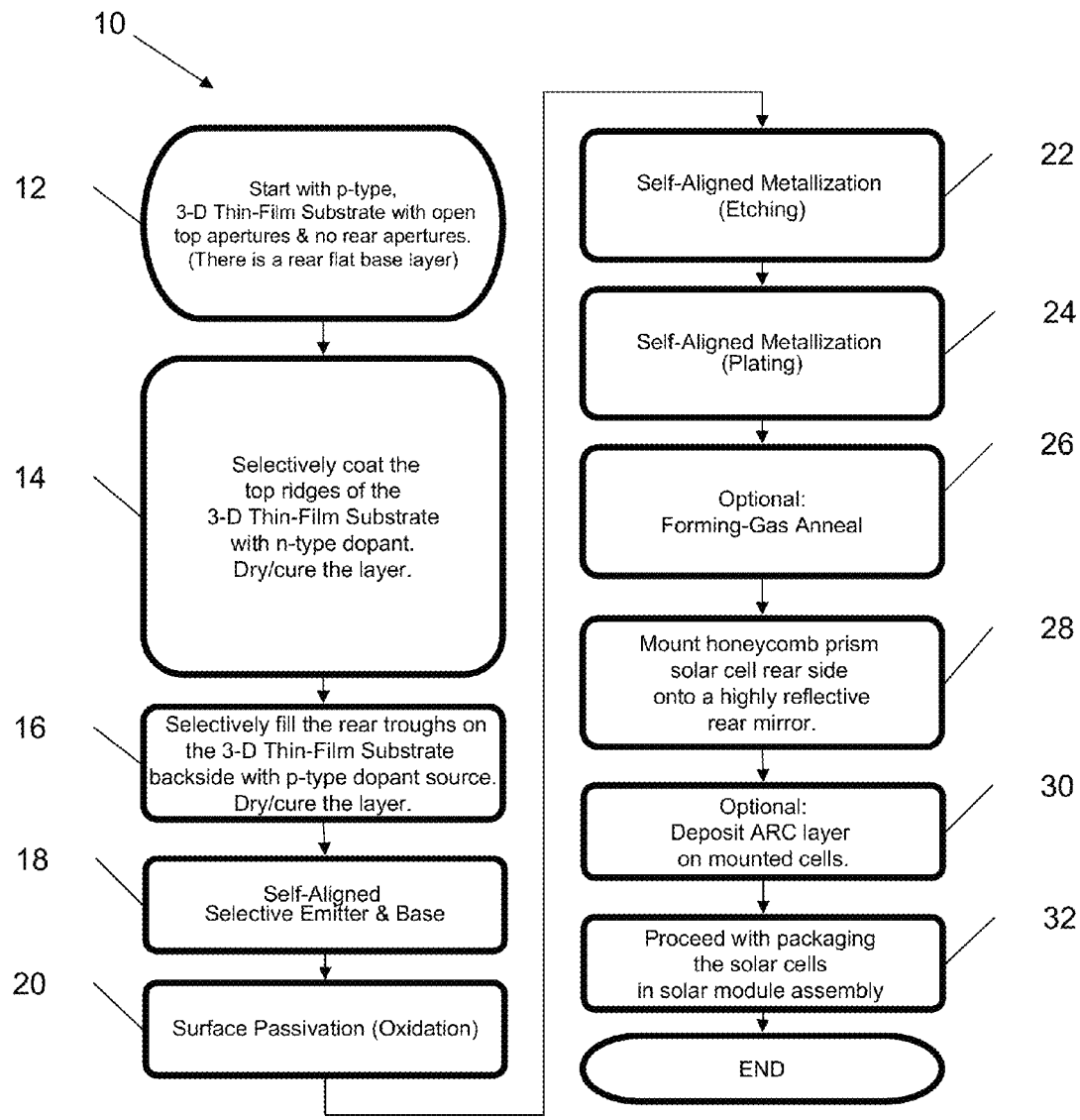

The following description of a process flow for forming a 3-D TFSC substrate is intended to enable one having ordinary skill in the art to make or use the claimed subject matter. The description of a hexagonal unit cell is not intended to limit the scope of the present disclosure, but only to convey the principles and teachings of the present disclosure. The teachings of the present disclosure may be generally applicable to any unit cell shape. It should be noted that FIG. 1 of the present disclosure corresponds to FIG. 15 of the '887 disclosure. Further, it should be noted that FIG. 1 represents one of many process flows which may be used to create 3-D TFSC substrates. For a more complete understanding of other process flows which may be used to create a 3-D TFSC, the reader is directed to the '887 publication.

FIG. 1 shows process flow 10 for fabrication of single-aperture (or sunnyside aperture) hexagonal-prism 3-D TFSCs with rear base layers (rear side closed with a thin silicon layer) using self-aligned selective plating metallization with boron-doped $p^{++}$ rear base contacts by selective base doping (besides selective emitter doping). This hexagonal-prism 3-D TFSC with rear base layer uses a detached rear mirror (i.e., rear mirror is not an integrated layer directly deposited on the rear base layer). In step 12, cell processing starts with a single-crystal (or multicrystalline or polycrystalline) p-type (for n-type emitter or selective emitter), 3-D silicon TFSC substrate (e.g., a 3-D array of honeycomb hexagonal prisms). As with any other cells in this disclosure, the substrate doping polarity may be changed to n-type (for p-type emitter or selective emitter). The 3-D honeycomb prism TFSC substrate has open top apertures and no rear apertures (due to the rear base layer). There is a rear relatively flat (or substantially planar) base silicon layer (possibly with some topography) monolithically and integrally attached to the honeycomb-prism cell.

Step 14 involves selectively coating the top ridges of the 3-D honeycomb prisms or in another embodiment coating down the sidewall to a small extent (2 to 10 microns) in addition to the top ridges with an n-type dopant source (the dopant polarity will be reversed for an n-type starting substrate). In one embodiment, this n-type dopant source is phosphorus. Selective coating may be done by self-aligned roller coating using paste/liquid source, liquid-dip coating by dipping in a known liquid source depth, ink-jet coating, or spray coating. In another embodiment, the selective coating can be achieved using techniques such as screen printing either in a pattern or blanket without a pattern. Next, the n-type dopant source layer is dried and cured (e.g., by thermal curing at 250° C. to 400° C. or UV irradiation).

Step 16 involves selectively filling the rear base troughs on the substrate backside with a p-type liquid/paste dopant source layer. In one embodiment, the p-type dopant source is boron. Selective filling may be done by boron source layer coating (e.g., roller, spin-on, ink-jet, or spray coating) followed by selective etch-back (e.g., by solvent spin-on) to form filled troughs. Next, the p-type dopant source layer is dried and cured (e.g., by thermal curing at 250° C. to 400° C. or UV exposure).

Step 18 involves forming self-aligned selective emitter and base regions. The top $n^{++}p$ emitter diffusion contact, top aperture $n^+p$ selective emitter junctions, rear $p^{++}$ base contacts and selectively doped $p^+$ base regions (the latter are optional) are concurrently formed. This may be done using thermal anneal in a diffusion furnace at an appropriate temperature, for example between 800° C. and 1000° C. In one embodiment, the 3-D TFSC substrate is annealed while placed in an in-line diffusion furnace, or with stacks of 3-D TFSC substrates in face-to-face contact to facilitate vapor-phase doping formation of $n^+$ emitter and $p^+$ base.

Step 20 involves surface passivation (e.g., oxidation), where a thermal oxide layer is grown, in one embodiment by steam oxidation (e.g., 10 to 200 nanometers at 800° C. to 1000° C.). Step 20 may be merged into the prior diffusion step in a multi-zone furnace, to be performed sequentially after the selective emitter and base diffusion step. In one embodiment, the diffusion/oxidation steps result in selective emitter and emitter contact sheet resistance values in the ranges of 70 to 150 $\Omega$/square and 10 to 70 $\Omega$/square, respectively.

Step 22 involves selective etching of the cured layers in preparation for self-aligned metallization. The dopant source layers are selectively etched (i.e., the n-type coating on top honeycomb prism ridges and the p-type coating in rear filled troughs) with a suitable dielectric etchant (e.g., an HF-based etchant) with high selectivity with respect to thermal oxide. This selectively strips the cured doped and undoped dielectrics on the top and rear portions of the substrate and exposes silicon in those regions, while removing only a small fraction of thermal oxide from other 3-D TFSC substrate regions.

Step 24 involves self-aligned metallization (in one embodiment, by plating). The front and rear emitter and base metallized regions are concurrently formed using selective electroplating and/or electroless plating and/or galvanic plating to form single or multilayer high-conductivity metallized regions (e.g., silver, aluminum, nickel, titanium, cobalt, or tantalum). For instance, the plated metal stack may include a thin (50 to 500 nanometers) barrier and adhesion layer such as nickel followed by a relatively thick (2 to 30 microns in some embodiments) layer of high-conductivity metal (e.g., silver, copper, aluminum, or a suitable metallic alloy). If a high-conductivity metal other than silver is used for the thick metallization layer, a final flash coat of silver may be used to create a high-reflectivity surface coating in order to improve light reflection and trapping into the 3-D cells (by the emitter metallization contact).

Step 26 involves an optional forming-gas anneal. A forming gas anneal may be performed (e.g., at 350° C. to 450° C.) to reduce front and rear interconnect resistance values and help with improving surface and bulk passivation.

Step 28 involves mounting honeycomb prism TFSC rear side (base side) onto a highly reflective (diffuse with a rough surface or specular with a smooth surface) rear mirror. This rear mirror may be made of silver-coated aluminum or copper foil and may also serve as the TFSC base interconnect plane on a printed-circuit board (PCB) in a solar module.

Step 30 involves an optional step of depositing a passivation and Anti-Reflection Coating (ARC) layer on mounted cells. In one embodiment, this passivation and ARC layer is PVD or PECVD silicon nitride ($SiN_x$) with thickness between 50 and 200 nanometers. Step 32 involves proceeding with packaging the honeycomb prism TFSCs in solar module assembly.

Now that the reader has been introduced to a basic process flow for forming a 3-D TFSC substrate with single-unit apertures, the reader is directed back to the subject matter of the present disclosure. In this disclosure, a process flow for creating a 3-D TFSC having dimensional variations across the planar region of the substrate is presented. Dimensional variations of unit cells across the substrate produce specific advantages in substrate strength, efficiency, and metal coverage modulation. Further, dimensional variations may reduce process cost and complexity by reducing process parameters associated with substrate formation. For example, a stronger 3-D TFSC substrate design augments yield and throughput in the manufacturing process, thereby decreasing cost.

Additionally, the enhanced 3-D TFSC substrate of the present disclosure may be produced with process flows substantially similar to those of the '409 application. Since only the mask design needs to be changed to produce a different template, all other process steps may remain essentially the same. The teachings of the present disclosure mitigate process complexity.

FIG. 2A shows exemplary unit cell 50 having a hexagonal shape. Unit cell 50 includes a wall 52 enclosing a trench area 54. It should be noted that the hexagonal shape of unit cell 50 is not intended to limit the scope of the present disclosure, but is only used as a vehicle for teaching the applications of the present disclosure.

FIGS. 2B and 2C show the dimensions of interest. FIG. 2B shows a top-view of honeycomb structure 56, including a number of unit cells 50. Each unit cell 50 includes a wall 52 having wall thickness (T) 60. The wall encloses a trench 54. The trench has an aperture diameter ($D_a$) 58. As noted previously, the hexagonal shape of unit cell 50 and honeycomb structure 56 are not meant to limit the scope of the present disclosure, but represent only one possible shape for implementing the teachings of the present disclosure.

FIG. 2C shows a side-view of the same honeycomb structure 56. FIG. 2C also illustrates dimensions 58 and 60 shown in FIG. 2B. However, FIG. 2C also shows other dimensions of interest such as wall height (H) 64. Further, the methods of the present disclosure may be used to control base thickness ($T_b$) 66 of honeycomb structure 56. Other dimensions of interest may include taper angle ($\theta$) 70. Finally, it should be noted that the present disclosure may implement other light scattering features such as hillocks 62 to enhance efficiency. These hillocks may or may not be periodic and are produced as part of the template 3D pattern. Also, dimensional variations enhance the metal coverage properties of a 3-D TFSC to make gains in efficiency. Typically, metal contact 68 covers the tips of walls 52.

By varying unit cell dimensions (especially aperture diameter 58, wall thickness 60, and wall height 64) across the 3-D TFSC substrate, specific gains in mechanical strength, efficiency, and cost may be made. Varying these dimensions also produces specific tradeoffs in fractional metal coverage. Now that the specific dimensions of interest have been introduced, examples of variations in these dimensions will be given.

Although the aperture diameter may be in any desired pattern, a specific embodiment entails decreasing the aperture diameter towards the edges of a 3-D TFSC substrate. This decrease may be either abrupt or gradual. Decreasing aperture diameters towards the edges of a 3-D TFSC substrate serves to increase the mechanical strength of the substrate. This is because the silicon fraction increases as aperture decreases. This pattern of variation is especially beneficial for strengthening the edges, which often times are the weak points for mechanical strength and are most sensitive to mechanical handling yield losses.

Figure 3:
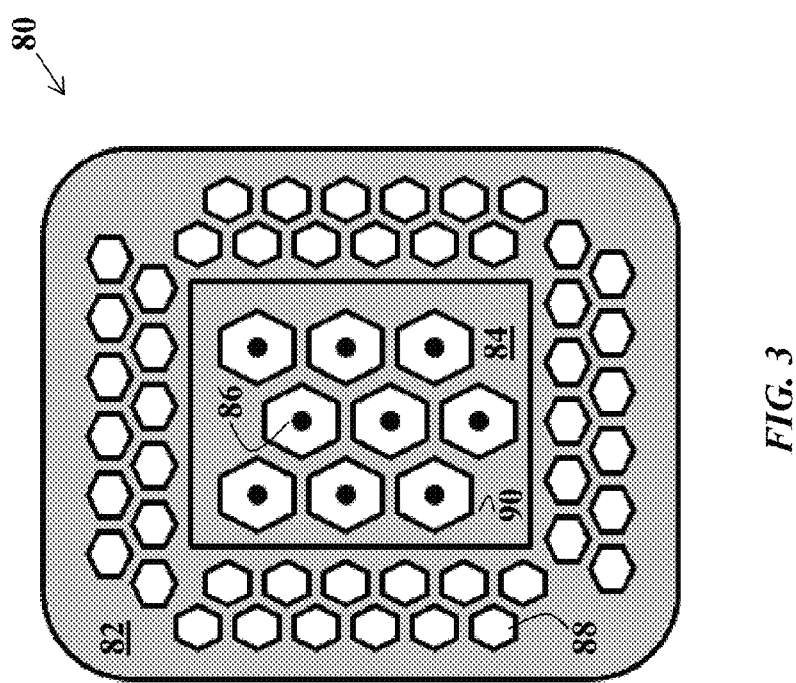

FIG. 3 shows 3-D TFSC substrate 80 wherein unit cell apertures are decreased abruptly, thereby increasing mechanical strength. FIG. 3 shows area 82 with unit cells 88 having a smaller aperture diameter (~25 microns) and area 84 with unit cells 90 having a larger aperture diameter (~145 microns). Further, unit cells 90 in area 84 include light scattering features 86. Light scattering features 86 may include structures such as hillocks or posts within the trench area of the unit cell. Typically, light scattering features 86 are substantially smaller than unit cell walls.

Area 82 having unit cells 88 with smaller aperture diameters at the edge of 3-D TFSC substrate 80 increases the strength of substrate 80 while only marginally compromising efficiency. Smaller aperture diameters of unit cells 88 mean more overall silicon in area 82, thus, an increase in strength of the entire substrate. Since the mechanical strength may be greatly increased by increasing silicon volume at the edges, the base thickness of the 3-D TFSC substrate may be reduced for the entire substrate, thus reducing overall silicon consumption.

The reader will note the powerful implications of this concept. Using the teachings of the present disclosure mechanical strength may be increased while actually reducing silicon consumption, thereby reducing cost. That is, for a given mechanical strength, silicon consumption may be reduced by using the teachings of the present disclosure. As a corollary, for a given silicon volume, mechanical strength may be increased.

In some cases, the increase in mechanical strength may come with a slight performance penalty. The slight compromise in efficiency results from increased metal coverage in area 82. Metal contacts cover the highest exposed silicon areas, when applied using a variety of techniques such as through a process known as Liquid Transfer Coating (LTC). When aperture diameters are reduced, exposed silicon increases. This results in increased metal coverage. This, in turn, results in a larger amount of light reflected back, thus decreasing short circuit current density and efficiency. However, the loss may be engineered to be very small (~1-2%) while making large gains in strength.

Figure 4:
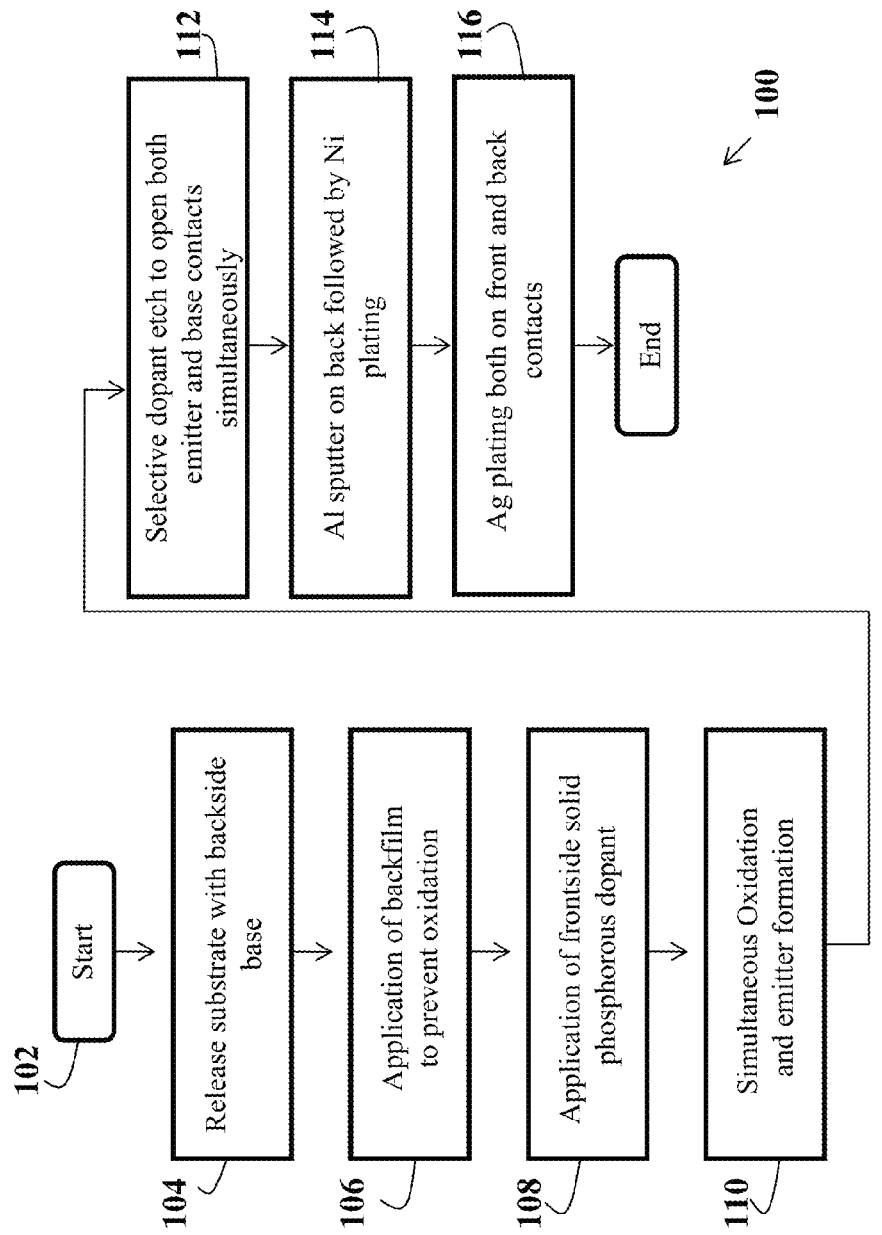

3-D TFSC substrate 80 of FIG. 3 may be obtained through process flow 100 of FIG. 4. Step 102 involves epitaxially growing a 3-D TFSC substrate on a template. Step 104 releases the 3-D TFSC substrate having a backside base from the template. Step 106 selectively applies a back-film to the substrate. In step 108, an LTC process selectively coats a front-side solid phosphorous dopant on the honeycomb wall tips. Selective application of the phosphorous dopant to honeycomb tips prevents oxidation in step 110. The reader will note that a selective etching process may remove the phosphorous dopant, forming an open contact on the honeycomb tips. Metal may be selectively applied to open contact areas.

Step 110 simultaneously forms an emitter and an oxidation layer on the 3-D TFSC substrate. In step 112, a selective dopant etch process opens both emitter and base contacts simultaneously. During step 114, a sputtering process deposits Al on the base followed by a Ni plating process. In step 116, an Ag plating process forms both front and back contacts.

Figure 5:
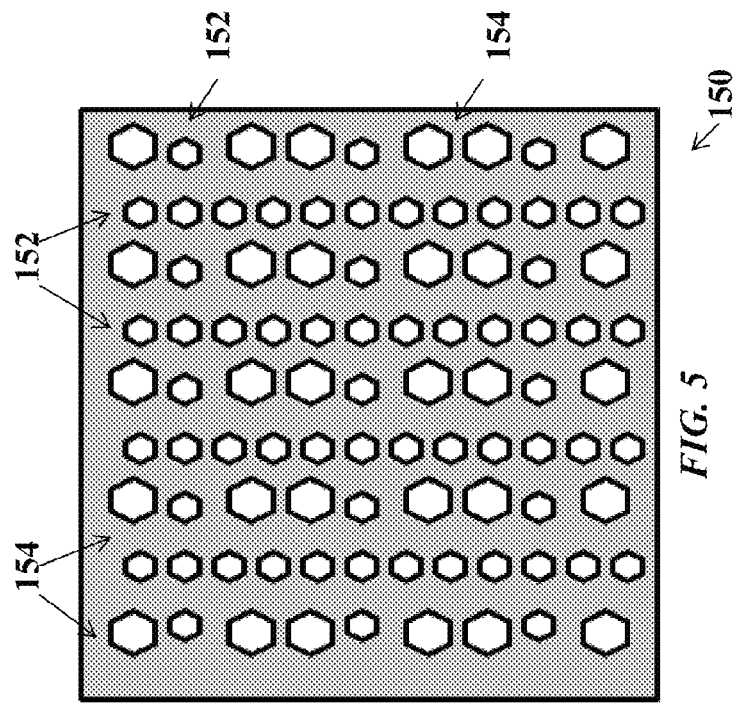
FIG. 5 shows a diagram of a 3-D TFSC substrate wherein the unit cells are arranged in a grid-like pattern.

FIG. 5 shows 3-D TFSC substrate 150 with unit cells 152 having smaller aperture diameters interweaved with unit cells 154 having larger aperture diameters. Thus, FIG. 5 shows 3-D TFSC substrate 150 with unit cells 152 and 154 interweaved in a grid-like pattern. Using the teachings of the present disclosure, one having ordinary skill in the art will note that other patterns may also be formed.

The dimensional variations of unit cells 152 and 154 across 3-D TFSC substrate 150 facilitate two functions. First, the pattern significantly increases mechanical strength while only minimally compromising efficiency. Next, areas of 3-D TFSC substrate 150 having smaller aperture unit cells 152 enable soldering to external metal.

As described in connection with process flow 100 of FIG. 4, metal contacts may be placed on honeycomb tips or exposed silicon areas. By decreasing unit cell 152 apertures in certain areas of 3-D TFSC substrate 150, those areas facilitate soldering to external metal. Soldering to unit cells with smaller apertures is easier because there is more fractional silicon area available to solder to.

Figure 6:
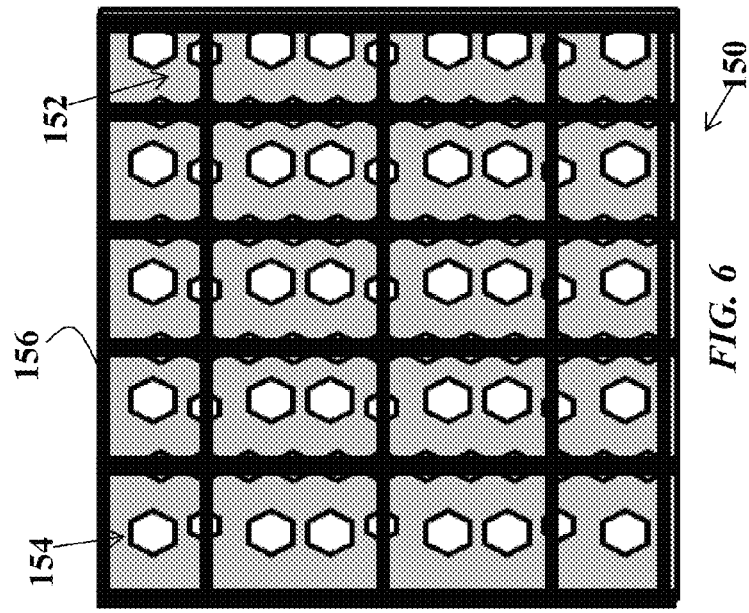
FIG. 6 illustrates the 3-D TFSC substrate of FIG. 5 with metal contacts.

FIG. 6 illustrates a substantially similar 3-D TFSC substrate 150 having unit cells 152 with smaller apertures and unit cells 154 with larger apertures. Further, FIG. 6 shows external metal contacts 156 which have been soldered in areas with smaller aperture unit cells 152.

One skilled in the art will note that variations in the teachings of the present disclosure could be applied to a number of different unit cell dimensional configurations. Local variations could be employed to facilitate targeted tradeoff decisions in one local area of a 3-D TFSC substrate. Global variations could account for unit cell dimensional variations across the 3-D TFSC substrate. Further, periodic, non-periodic, gradual, and abrupt dimensional variations could be employed to facilitate tradeoff decisions as needed. In another embodiment, edge variations in unit cell apertures could be used to strengthen a 3-D TFSC substrate. Further, a plurality of aperture diameters could enable tradeoff decisions as needed.

Other dimensional variations such as variations in wall thickness and wall height may serve several purposes, such as metal coverage modulation, better light trapping, and increasing mechanical strength. Increasing wall thickness in specific areas of the 3-D TFSC increases the silicon volume of those areas, providing enhanced strength.

This method employs the fact that, during template formation, different trench openings result in different etch depths for the deep reactive ion etch (DRIE) process due to etch lag. In particular, narrower trench widths give shallower trench depths. As before, the examples will be given in relation to a hexagonal or honeycomb structure, but the general principle may be applied to other shapes. Additionally, the techniques to be disclosed may be used in combination with or separately from the techniques disclosed above.

FIG. 7A shows a cross-sectional view of 3-D TFSC substrate 200 employing walls B 204 and walls A 206 having variations in wall height and wall thickness. Walls B 204 formed with a wider trench portion of a template and therefore a deeper etch during DRIE have larger wall height and wall thickness than walls A 206. Metal contacts 202 may be selectively formed on walls B 204. FIG. 7A shows wall height varied on the local level within the unit cell. LTC coating selectively applies a dopant on walls B 204, thus, only these walls end up having metal contacts 202. This basic principle enables arbitrary metal patterns with local/global, periodic/non-periodic, and gradual/abrupt variations.

FIG. 7B shows a top-view of 3-D TFSC substrate 200 shown in FIG. 7A. FIG. 7B again shows walls B 204 with metal contacts 202 and shorter walls A 206 with no metal contacts.

FIG. 8 shows process flow 250 for creating variable unit cell wall heights and wall thicknesses. In step 252, negative-photomask 260 forms template 262 through a DRIE process.

Mask 260 includes unit cells having wall thickness 266 and 268. Further unit cells in the mask include apertures 264. As indicated, walls 266 are narrower than walls 268.

Template 262 includes unit cell formation areas. Unit cell formation areas include wall formation areas 274 and 276. Further, unit cell formation areas include trench formation areas having aperture formation areas 277. As indicated by reference numeral 270, narrower walls 266 on mask 260 correspond to narrower wall formation areas 276 on template 272. Wall formation areas 276 are also shorter than wall formation areas 274. As explained earlier, during the DRIE process narrower trenches will etch to shallower etch depths. Although the present example references negative-photomask 260, a positive-photomask may also create template 262.

In step 254, an epitaxial fill process forms 3-D TFSC substrate 278 on template 262. Step 256 releases substrate 278 from template 262. Released substrate 278 includes walls 280 and 282. Wall formation areas 274 of template 262 form walls 280 of released 3-D TFSC substrate 278. Wall formation areas 276 of template 262 form walls 282 of 3-D TFSC substrate 278. Thus, narrower wall formation areas of template 262 form narrower and shorter walls of released 3-D TFSC substrate 278. Template 278 also includes trenches 284 having apertures.

In step 258, LTC selectively coats taller walls 280 of 3-D TFSC substrate 278. As shown in FIG. 8, LTC selectively coats phosphorous dopant 286 on taller walls 280 without coating shorter walls 282. Later, metal contacts may be selectively formed on taller walls 286 as well.

Although the present example shows a non-periodic variation in wall thickness and height, other variations could enhance mechanical strength, light trapping, and metal coverage modulation. Local variations could be employed to facilitate targeted tradeoff decisions in one local area of a 3-D TFSC substrate. Global variations could account for unit cell dimensional variations across the 3-D TFSC substrate. Further, periodic, non-periodic, gradual, and abrupt dimensional variations could be employed to facilitate tradeoff decisions as needed.

In one embodiment, the wall formation areas are made narrower towards the edges of the template. Narrower walls at the edge of the template correspond to shorter walls at the edge of the released substrate. This variation enhances the mechanical strength of the released substrate.

Other features may also be included in the mask design without varying from the scope of the present disclosure. For example, the mask design could implement the light scattering features of FIG. 2. FIG. 9 shows positive-photomask 300 which implements these light scattering features. Mask 300 includes unit cells having walls 304 and 306. Walls 304 are narrower than walls 306. Further, unit cells include apertures 302. Finally, mask 300 includes light scattering features 308.

Typically, light scattering features 308 are narrower than walls 306 and 304. In turn, light scattering features 308 lead to small pillars interspersed in the trenches of a released 3-D TFSC substrate. These pillars enable better light scattering, and thus better efficiency.

One having ordinary skill in the art will note that various types of masks may be used to form features in the template and, in turn, the resulting 3-D TFSC substrate. For example, either a negative or positive mask could be used to form the template. Depending on which type of mask is used, the pattern on the mask may be reversed from the resulting image formed on the template.

Finally, although aperture size, wall thickness, and wall height are discussed separately, this discussion does not preclude having a combination of aperture, wall thickness, and wall height variation in a single embodiment to enhance mechanical strength, light trapping, and metal coverage modulation properties.

The present disclosure presents a three-dimensional thin film solar cell substrate having enhanced mechanical strength, light trapping, and metal modulation coverage properties. The substrate includes a plurality of unit cells. Each unit cell structure includes a wall enclosing a trench. Further, the unit cell includes an aperture having an aperture diameter. For the purposes of the present disclosure, the dimensions of interest include wall thickness, wall height, and aperture diameter. A pre-determined variation in these dimensions among unit cells across the substrate produces specific advantages. A variation in wall thickness enables enhanced mechanical strength by increasing silicon volume in specific areas of the substrate. A variation in wall height allows enhanced metal coverage modulation properties. In addition, it also enables soldering to external metal in specific areas of the substrate. A variation in aperture diameter enables enhanced mechanical strength by reducing the aperture diameter in specific areas of the substrate. Each variation may also enable better light trapping.

In one embodiment, unit cell aperture diameters are varied to increase mechanical strength and to facilitate soldering of metal contacts. These variations may come in many forms, such as local, global, periodic, non-periodic, abrupt, gradual, edge, or center variations. Using the teachings of the present disclosure, one having ordinary skill in the art could combine these forms to achieve powerful results based on engineering tradeoff decisions. For example, aperture diameters towards the edge of a 3-D TFSC substrate could be decreased to increase the mechanical strength while only marginally compromising efficiency.

In another embodiment, wall thickness and height may be controlled during the DRIE etch process while forming the template. As noted above, features of the template form reverse features in a released 3-D TFSC substrate. Other light scattering features such as hillocks may also be formed to increase the light trapping efficiency.

Dimensional variations in the unit cell across a 3-D TFSC substrate may also reduce manufacturing costs. Since specific dimensional variations may increase the mechanical strength of a 3-D TFSC substrate, process parameters may also be relaxed. In turn, this may produce a higher yield rate and in some cases increased throughput. Further, for a given amount of silicon the method of the present disclosure could be used to produce a stronger 3-D TFSC substrate than other known processes. As a corollary, less silicon may be used to produce a 3-D TFSC substrate satisfying a given strength requirement.

Additionally, since only the mask design needs to be changed to accommodate different unit cell dimensions, the other process steps may remain the same. Thus, the method of the present disclosure adds very little process complexity. In fact, because the mechanical strength of the 3-D TFSC substrate may be increased, process complexity may be reduced.

The foregoing description of the preferred embodiments is provided to enable a person skilled in the art to make or use the claimed subject matter. Various modifications to these embodiments will be readily apparent to those skilled in the art, and the generic principles defined herein may be applied to other embodiments without the use of the innovative faculty. Thus, the claimed subject matter is not intended to be limited to the embodiments shown herein but is to be accorded the widest scope consistent with the principles and novel features disclosed herein.

What is claimed is:

1. A three-dimensional thin film solar cell substrate comprising:
- a plurality of unit cells comprising a first wall segment and a second wall segment, said first wall segment having a wall height larger as compared to said second wall segment, wherein each said unit cell comprises:
  - a single aperture unit cell having a predetermined light capturing three-dimensional structure defined by said first wall segment and said second wall segment, said wall segments enclosing a trench area;
- said first wall segment forming a metallization pattern across said solar cell; and
- metallization on said first wall segment.

2. The three-dimensional thin film solar cell substrate of claim 1, wherein said trench areas comprise discrete light capturing hillocks having a height less than said second wall segment.

* * * * *